United States Patent
Lee (10) Patent No.: US 6,732,060 B1
(45) Date of Patent: May 4, 2004

(54) SYSTEM AND METHOD FOR AN INTERFACE INVARIANT TEST CASE

(75) Inventor: Douglas Lee, Cupertino, CA (US)

(73) Assignee: Adaptec, Inc., Milpitas, CA (US)

( * ) Notice: Subject to any disclaimer, the term of this patent is extended or adjusted under 35 U.S.C. 154(b) by 171 days.

(21) Appl. No.: 10/140,307

(22) Filed: May 6, 2002

(51) Int. Cl.$^7$ .......................... G01R 27/28; G01R 31/00
(52) U.S. Cl. ............................................ 702/118; 716/5
(58) Field of Search ............................... 702/108, 118; 716/1, 4, 19; 703/13, 14, 15

(56) References Cited

U.S. PATENT DOCUMENTS

| | | | | |
|---|---|---|---|---|
| 6,477,683 B1 | * | 11/2002 | Killian et al. ................... | 716/1 |
| 6,611,947 B1 | * | 8/2003 | Higgins et al. ................. | 716/5 |
| 2002/0147560 A1 | * | 10/2002 | Devins et al. ............... | 702/118 |
| 2003/0093764 A1 | * | 5/2003 | Devins et al. .................. | 716/5 |
| 2003/0101393 A1 | * | 5/2003 | Watkins ....................... | 714/724 |
| 2003/0145290 A1 | * | 7/2003 | Devins et al. .................. | 716/4 |
| 2003/0149946 A1 | * | 8/2003 | Devins .......................... | 716/4 |
| 2003/0154061 A1 | * | 8/2003 | Willis ........................... | 703/4 |

OTHER PUBLICATIONS

10/090,353, filed Mar. 1, 2002, entitled "Apparatuses and Methods for Modeling Shared Bus Systems".

10/140,236, filed May 6, 2002, entitled "System and Method for Developing Multiple Test Cases from a Base Test Case".

* cited by examiner

*Primary Examiner*—John Barlow
*Assistant Examiner*—Demetrius Pretlow
(74) *Attorney, Agent, or Firm*—Martine & Penilla, LLP (57) ABSTRACT

A system and method for comparing performance of two or more devices is disclosed. The method includes defining a workload. A workload object is provided. The workload object includes a transaction generator. A first test case is applied to a first device. Executing the transaction generator on a first test object produces the first test case. The first test object includes multiple first interface properties. Executing the transaction generator on the first test object produces a first set of transactions according to the first interface properties. The first set of transactions stimulates the defined workload in the first device. A second test case is applied to a second device. Executing the transaction generator on a second test object produces the second test case. The second test object includes multiple second interface properties. Executing the transaction generator on the second test object produces a second set of transactions according to the second interface properties. The second set of transactions stimulates the defined workload in the second device. A first test result from the first test case is compared to a corresponding second test result from the second test case.

20 Claims, 6 Drawing Sheets

SYSTEM AND METHOD FOR AN INTERFACE INVARIANT TEST CASE

CROSS REFERENCE TO RELATED APPLICATIONS

This application is related to U.S. patent application No. 10/090,353, filed on Mar. 1, 2002 and entitled "Apparatuses and Methods for Modeling Shared Bus Systems," and U.S. patent application No. 10/140,236 filed on May 6, 2002 and entitled "System and Method For Developing Multiple Test Cases From A Base Test Case", both by Douglas Lee, which are incorporated herein by reference in their entirety.

BACKGROUND OF THE INVENTION

1. Field of the Invention

The present invention relates generally to device testing processes, and more particularly, to methods and apparatus for developing testing systems for comparison testing of two or more similar electrical devices.

2. Description of the Related Art

Development of a new device such as an integrated circuit, or other electronic device, requires extensive testing to determine if a proposed design meets the design performance requirements. One approach to developing a new device includes simulating the device such as by designing a computer program that simulates the operation of the device. Such a computer program is typically referred to as a device simulation. Device simulations are typically run in a test bench environment. Multiple test procedures or test cases are then applied to a device simulation running on the test bench. A test suite is a collection of test cases that test multiple functions of a simulated device.

Typically each test case is in the form of computer readable code executable by the test bench. A test case causes the test bench to apply stimuli to the device simulation and record the simulated device operation. Various functions of the simulated device can then be tested. Simulated device operations can include input, output, processing, events, signal levels, and any other device function.

Test cases are often written using object oriented programming languages such as C++, Java™, Vera and other languages. Generally speaking, methods of a test object are designed to invoke the methods of a number of objects, thus causing very specific stimuli to be applied the device simulation.

Accordingly, the code programmed for each test case is specifically designed for each device to be tested. In practice, a test case for a device (e.g., a second-generation of the device) is typically developed by first selecting a similar device (e.g., a previous generation of the device) that is most similar to the device. A first test case for the similar device is selected because the first test case presumably, successfully tested the similar device and is therefore believed to be accurate, comprehensive and properly debugged. The first test case is then modified to test the specific function of the device to be tested.

As a result, the test cases often become difficult to determine precisely what functions of the device are being tested. Further, as the test cases become successively modified, the performance data can become more difficult to obtain and less accurate and less comprehensive. Accurate and comprehensive performance data is important so that a first device under test can be directly and accurately compared to another device under test (e.g., a second-generation device).

In addition, developing a new test suite for a second-generation device upon the test suite developed for a first generation device typically requires extensive man-hours to modify and debug. Further, if a fault is found in the new test suite and the fault is corrected during the testing or development of the second-generation device, then the fault may also apply to the first generation device. Therefore the test suite for the first generation device may also require a corresponding correction.

A test suite may include many hundreds of test cases that are similar. When a defect is found in a selected test case, often most or all of the similar test cases must also be corrected. Therefore, even a minor defect discovered in one test case in the new test suite, often results in extensive efforts to update each of the similar test cases in the new test suite and in any similar test suites.

Device manufacturers are under constant pressure to reduce the development time for new devices. One area of reducing the development time is reducing the time required to test various proposed, and often competing configurations of the device. As discussed above, the prior art approach to testing a new device was to modify an existing test object to generate a modified test case, which can then be applied to the new device. However, the administrative management requirements of the prior art approach cause additional delays in device development time.

Another area for reducing the development time is an evaluation of multiple configurations or designs of a device at an early stage in the development cycle. For example, if two competing designs are proposed for a new product, each of the competing designs must be evaluated to select the design to carry forward into production. Often, in the prior art, both of the competing designs must be carried through to the hardware stage so that the two designs could then be tested as actual hardware circuits (e.g., integrated circuits) installed in a host system, such as a host computer system, and the resulting performances compared. The two designs cannot typically be readily tested and compared prior to the hardware stage because the prior art test cases typically do not produce accurate performance data that can be directly compared.

In view of the foregoing, there is a need for a system and method for rapidly generating test cases that produce accurate, comprehensive test results and that allow multiple configurations of a device to be accurately and directly.

SUMMARY OF THE INVENTION

Broadly speaking, the present invention fills these needs by providing a system and method for comparing performance of two or more devices is disclosed. The method includes defining a workload. A workload object is provided and the workload object includes a transaction generator. A first test case is applied to a first device. The first test case can be produced by executing the transaction generator on a first test object. The first test object can include multiple, first interface properties. Executing the transaction generator on the first test object can produce a first set of transactions according to the first interface properties. The first set of transactions can stimulate the defined workload in the first device. A second test case is applied to a second device. The second test case can be produced by executing the transaction generator on a second test object. The second test object can include multiple second interface properties. Executing the transaction generator on the second test object can produce a second set of transactions according to the second interface properties. The second set of transactions can stimulate the defined workload in the second device. A first test result from the first test case can be compared to a corresponding second test result from the second test case.

In another embodiment, the first interface properties are included in a first interface object. The first test object can inherit the first interface object and the workload object.

In another embodiment, the first interface object can include several interface objects. The interface objects can include a host interface object and a peripheral interface object.

In one embodiment, the interface objects can include a parameter object. The parameter object can define a parameter that corresponds to a parameter of the first device.

In one embodiment, the second interface properties can be included in a second interface object. The second test object can inherit the second interface object and the workload object.

In one embodiment, the defined workload is generic to several members of a device family.

In one embodiment, the first set of transactions includes at least one of a group consisting of a read, a write, an event and an interrupt. In one embodiment, the second set of transactions includes at least one of a group consisting of a read, a write, an event and an interrupt.

In still another embodiment, a test bench is disclosed. The test bench includes a processor and a storage facility coupled to the processor. The storage facility includes instructions executable by the processor. The instructions include logic to receive a workload and logic to provide a workload object. The workload object can include a transaction generator. The instructions can also include logic to apply a first test case to a first device. Executing the transaction generator on a first test object can produce the first test case. The first test object can include multiple first interface properties. Executing the transaction generator on the first test object can produce a first set of transactions according to the first interface properties. The first set of transactions can stimulate the defined workload in the first device. The instructions can also include logic to apply a second test case to a second device. Executing the transaction generator on a second test object can produce the second test case. The second test object can include multiple second interface properties. Executing the transaction generator on the second test object can produce a second set of transactions according to the second interface properties. The second set of transactions can stimulate the defined workload in the second device. The instructions can also include logic to compare a first test result from the first test case to a corresponding second test result from the second test case.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Several exemplary embodiments for a system and method for an interface invariant test case will now be described. It will be apparent to those skilled in the art that the present invention may be practiced without some or all of the specific details set forth herein.

Often similar designs of a device are proposed and/or produced and the manufacturer will desire to compare the respective performance of the similar devices. In one embodiment of the present invention, the devices can be tested by dividing the testing so as to separate the actual work to be performed (i.e., the workload) from the device specific configurations required by each design for each respective design to perform the workload.

As will be described in more detail below, in one embodiment, the workload is defined and included in a base test object. Further, many other aspects of the device, such as the configuration specific requirements, can be reduced to additional base test objects. The base test objects can then be combined and extended in intermediate extending test objects or specific test objects to create a device specific test case object. A transaction generator can then generate transactions from the device specific test object to produce device configuration specific transactions that will stimulate a device having the corresponding device configuration to perform the workload.

Figure 1:
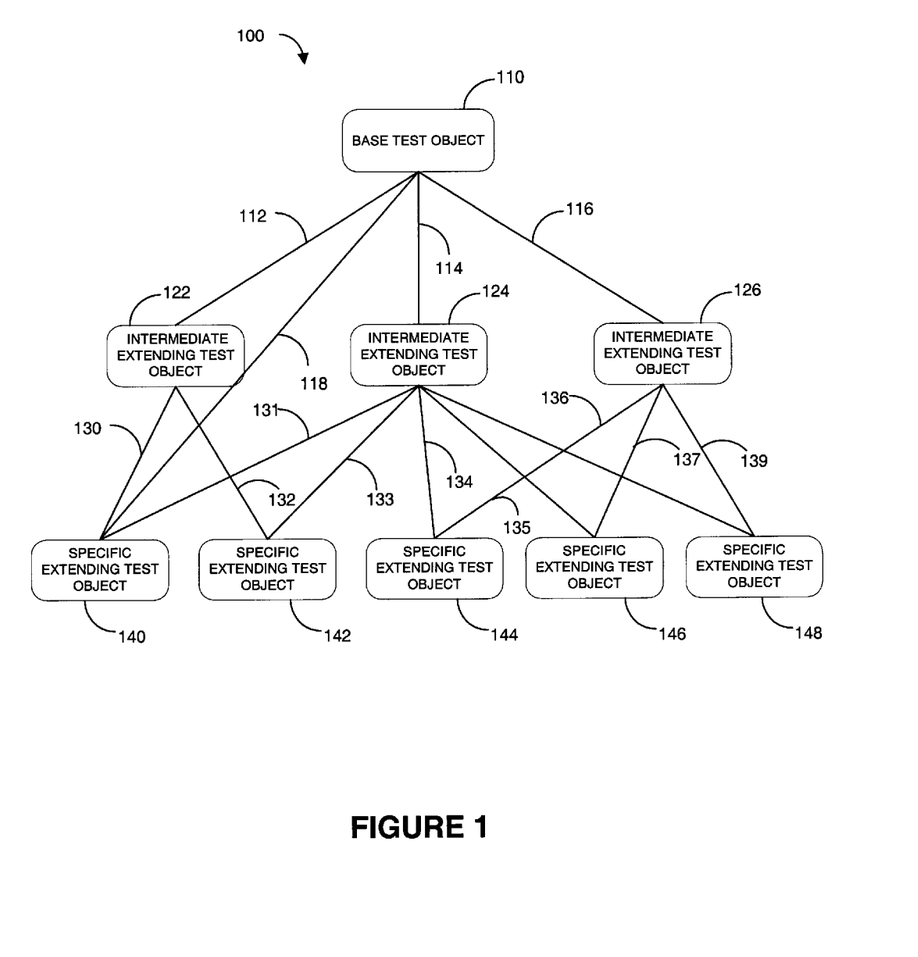
FIG. 1 is a graphical representation of an object-oriented program that implements a test suite in accordance with one embodiment of the present invention.

FIG. 1 describes one embodiment of a test objects that are produced using object oriented programming, in accordance with the present invention. Therefore a brief overview of object oriented programming language is provided. Test cases are often programmed in an object-oriented language such as C+, C++, Java™ and other object-oriented languages. Test cases can also be programmed in specialized language applications for test bench operations such as Vera, available from Synopsys, Inc. of Mountain View, Calif., Verilog and other similar programming languages.

Object-oriented programming is a method of creating computer programs by combining certain fundamental building blocks, and creating relationships among and between the building blocks. The building blocks in object-oriented programming systems are called "objects." An object is a programming unit that groups together a data structure (instance variables) and the operations (methods) that can use or affect that data. Thus, an object consists of data and one or more operations or methods that can be performed on that data. The joining of data and operations into a unitary building block is called "encapsulation."

An object can be instructed to perform one of its methods when it receives a "message." A message is a command or instruction to the object to execute a certain method. It consists of a method selection (name) and a plurality of arguments that are sent to an object. A message tells the receiving object what operations to perform.

One advantage of object-oriented programming is the way in which methods are invoked. When a message is sent to an object, it is not necessary for the message to instruct the object how to perform a certain method. It is only necessary to request that the object execute the method. This greatly simplifies program development.

Object-oriented programming languages are predominantly based on a "class" scheme. A class defines a type of object that typically includes both instance variables and methods for the class. An object class is used to create a particular instance of an object. An instance of an object class includes the variables and methods defined for the class. Multiple instances of the same class can be created from an object class. Each instance that is created from the object class is said to be of the same type or class.

A hierarchy of classes can be defined such that an object class definition has one or more subclasses. A subclass inherits its parent's (and grandparent's etc.) definition. Each subclass in the hierarchy may add to or modify the behavior specified by its parent class.

To illustrate, an employee object class can include "name" and "salary" instance variables and a "set_salary" method. Instances of the employee object class can be created, or instantiated for each employee in an organization. Each object instance is said to be of type "employee." Each employee object instance includes the "name" and "salary" instance variables and the "set_salary" method. The values associated with the "name" and "salary" variables in each employee object instance contain the name and salary of an employee in the organization. A message can be sent to an employee's employee object instance to invoke the "set_ salary" method to modify the employee's salary (i.e., the value associated with the "salary" variable in the employee's employee object).

An object is a generic term that is used in the object-oriented programming environment to refer to a module that contains related code and variables. A software application can be written using an object-oriented programming language whereby the program's functionality is implemented using objects.

FIG. 1 is a graphical representation of an object-oriented program 100 that implements a test suite in accordance with one embodiment of the present invention. The object-oriented program 100 includes a base test object 110. Several intermediate extending test objects 122, 124, 126 can extend the base test object 110. Several, more specific extending test objects 140, 142, 144, 146, 148 can also extend any one or more of the base test object 110 and the intermediate test objects 122, 124, 126.

The base test object 110 can include one or more tests or parameter settings to generate a basic test of a device or device simulation. In one embodiment, the base test object includes a transaction generator that generates transactions for testing an aspect of the device. In one embodiment, the basic test object 110 initializes the device under test, establishes basic operating parameters, sends an actual test stimulus to the device under test, and sets a test goal. The test goal can include an end event or condition. The base test object 110 can also include additional functions, tests, etc. In one embodiment, the base test object 110 is a generic test object that generates test transactions that are common across multiple devices such as a family of similar devices and/or generations of similar devices. Because the base test object 110 is generic, the base test object 110 can be used to test the same aspect of any one of several devices or generations of the device without modification to the base test object 110. Any modification to the base test object 110 will impact the transactions generated to test each of the multiple devices and/or generations of devices.

The base test object 110 may be used by or extended by any one or more of a number of other test objects such as intermediate test objects 122, 124, 126, as shown by the links 112, 114, 216 to perform more specific tests on the device under test. The intermediate test objects 122, 124, 126 can add additional detail or additional tests to the base test object 110. For example, the base test object 110 may be a test for an input/output device to read a portion of storage media (e.g., a memory location or a sector of recorded media), one time, at a data transfer rate of 33 MHz. Intermediate test object 122 can extend the base test object 110 by including reading the sector three times (i.e., extending the generate task to read the sector three times). The intermediate test object 122 can further extend the base test object 110 by modifying the data transfer rate from 33 MHz to 133 MHz. Alternatively, intermediate test object 124 can extend the base test object 110 by including reading the sector four times (i.e., extending the generate task to read the sector four times) and alternating the reading with an additional test of writing data to the same sector or a sequential sector or other sector that may be defined by the intermediate test object 124.

Similar to the base test object 110, the intermediate test objects 122, 124, 126 can then be used or called by any one or more of the more specific test objects 140, 142, 144, 146, 148 as shown by links 130–139. The specific test objects 140, 142, 144, 146, 148 can extend the intermediate test objects 122, 124, 126 by adding additional detail or specificity to the generated test transactions. In one embodiment, the specific test objects 140, 142, 144, 146, 148 can extend the intermediate test objects 122, 124, 126 to generate test transactions to test respectively defined specific configurations of the device. The specific test objects 140, 142, 144, 146, 148 can also extend the base test object 110 directly as shown by link 118. Additional test cases (not shown) may also use any one or more of the base test object 110, the intermediate test objects 122, 124, 126 and the specific test objects 140, 142, 144, 146, 148. Additional test objects with additional levels of detail may also be used.

Figure 2:
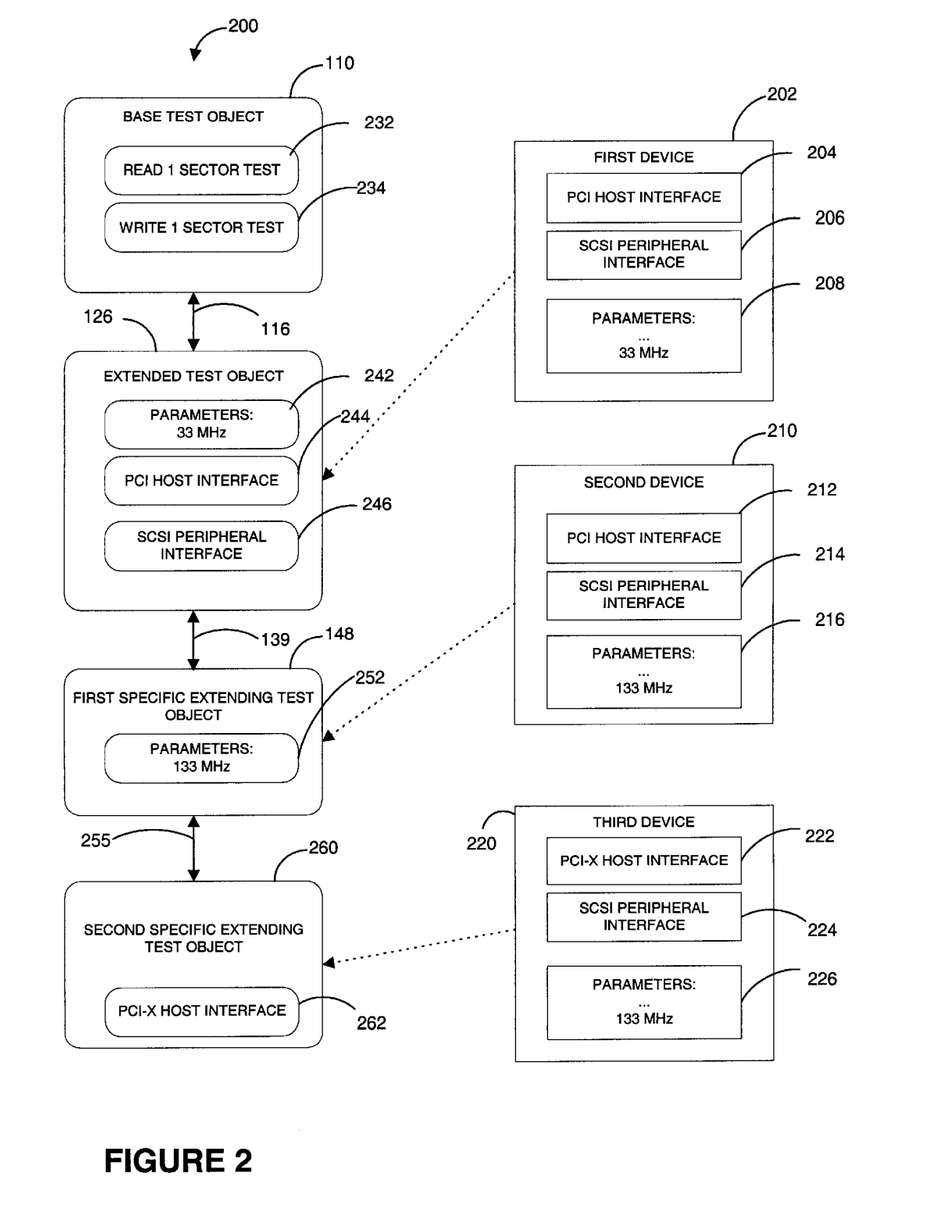
FIG. 2 is a block diagram of a test suite and the corresponding devices that are tested by the test suite, in accordance with one embodiment of the present invention.

FIG. 2 is a block diagram of an exemplary test suite 200 and the corresponding devices 202, 210, 220 that are tested by the test suite 200, in accordance with one embodiment of the present invention. The devices 202, 210, 220 are competing designs of input/output (I/O) controllers. The first device 202 includes a PCI host interface to a host computer and a SCSI interface to a peripheral device such as a hard drive. The first device also operates at 33 MHz and therefore a 33 MHz parameter is listed to further describe the first device 202. The second device 210 is substantially identical to the first device 202 except that the second device 210 operates at 133 MHz. The third device 220 is substantially similar to the second device 210 except that the third device 220 includes a PCI-X interface with the host computer.

The test suite 200 includes a base test object 110. The base test object 110 includes a "Read 1 Sector" test 232 and a "Write 1 Sector" test 234. The "Read 1 Sector" test 232 and a "Write 1 Sector" test 234 are both common generic tests that can be applied to any one of the three devices 202, 210, 220. The extending test object 126 is linked to and extends the base test object 110 to test the functions of the first device 202. The extended test object 126 extends the base test object 110 by specifying a parameter of 33 MHz 242 and defining the host interface as a PCI host interface 244 and the peripheral device interface to a SCSI peripheral device interface 246. Executing the extended test object 126 will cause the transaction generator to generate transactions according to the parameters and functions of the first device 202. For example the transactions that are generated by the extended test object 126 could include a device-to-host write transaction formatted for the PCI interface at 33 MHz. Similarly, the generated transactions can include a device-to-pefipheral device transaction formatted for the SCSI at SPI-3 protocol.

The first specific extending test object 148 is linked to and extends the extending test object 126 to include the parameter of 133 MHz 252 to correspond with the operating parameters of the second device 210. Executing the first specific extending test object 148 will cause the transaction generator to generate transactions according to the parameters and functions of the second device 210. For example the transactions that are generated by the first specific extending test object 148 could include a device-to-host write transaction formatted for the PCI interface at 133 MHz. Similarly, the generated transactions can include a device-to-peripheral device transaction formatted for the SCSI at SPI-4 protocol.

The second specific extending test object 260 is linked to and extends the first specific extending test object 148 to include the parameter of a device-to-host interface of a PCI-X interface 262 to correspond with the operating parameters of the third device 220. Executing the second specific extending test object 260 will cause the transaction generator to generate transactions according to the parameters and functions of the third device 220. For example the transactions that are generated by the second specific extending test object 260 could include a device-to-host write transaction formatted for the PCI-X interface at 133 MHz. Similarly, the generated transactions can include a device-to-peripheral device transaction formatted for the SCSI at SPI-4 protocol.

Figure 3A:
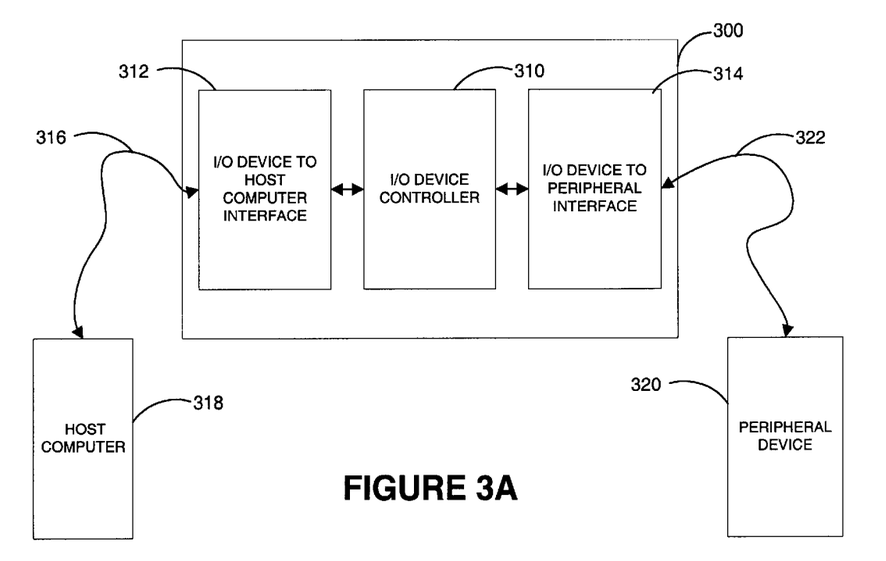
FIG. 3A is a block diagram of an input/output device in accordance with one embodiment of the present invention.

FIG. 3A is a block diagram of an input/output (I/O) device 300 in accordance with one embodiment of the present invention. The I/O device 300 includes an I/O device controller 310 and two interfaces 312, 314. The I/O device to host computer interface 312 provides an interface between the I/O device controller 310 and the host computer 318 such as a PCI, PCI-X, IDE or other suitable interface. A PCI bus can provide the connection 316 between the UO device controller 310 and the host computer 318 if the interface 312 is a PCI interface. The interface 312 provides a data path and format for the data to be exchanged between the I/O device controller 310 and the host computer 318. The I/0 device to peripheral device interface 314 provides an interface between the I/O device controller 310 and the peripheral device 320. For example, if the peripheral device 320 is a SCSI hard drive, then the interface 314 can be a SCSI interface and the connection 322 between the I/O device controller 310 and the peripheral device 320 is a SCSI specification cable or other suitable connection. In one embodiment, the I/O device 300 provides a PCI-X connection to the host computer 318 and a SCSI connection to the SCSI hard drive peripheral device 320. Thereby facilitating a data path and formats compatible with the host computer 318 to transfer data to and from the SCSI peripheral device 320 (i.e. hard drive).

Often families of similar I/O devices are developed at the same time. By way of example, a family of similar I/O devices can use the same I/O device controller 310 with different interfaces 312, 314 so that the same I/O device controller 310 can be used in more applications. The I/O device to host computer interface 312 can include a PCI, PCI-X, or other suitable interfaces. The I/O device to peripheral device interface 314 can include a SCSI, a serially attached SCSI (SAS), an Infiniband, ATA, IDE, EIDE, or any other suitable I/O device to peripheral device interface. The various combinations and configurations of interfaces provide an example of a family of similar I/O devices. In one embodiment, the respective performance of each configuration of the similar I/O devices can be determined using a single workload to produce respective performance benchmarks.

Figure 3B:
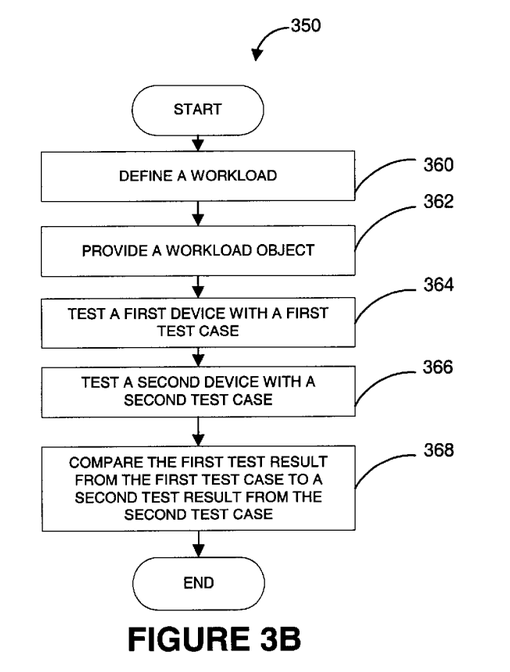
FIG. 3B is a flow chart diagram 350 of the method operations for generating two test cases for testing and comparing two corresponding devices, in accordance with one embodiment of the present invention.

FIG. 3B is a flow chart diagram 350 of the method operations for generating two test cases for testing and comparing two corresponding devices, in accordance with one embodiment of the present invention. A workload is defined in operation 360. The workload is a common workload that can be applied to any of the configurations of the devices to be tested. In one embodiment, the defined workload is abstracted from all device configuration specific detail so that the defined workload is generic to, and can be processed by, any of the configurations of the devices to be tested. The defined workload can include any generic function of the devices to be tested. For example, if the devices to be tested are I/O devices (e.g., I/O device 300 described above) a generic function could include a read function (e.g., read one sector) or a write function (e.g., write one sector). In other types devices to be tested other than an I/O device other corresponding generic functions could be included in the defined workload. For example an RDMA transfer for Infiniband, or packet transfers for Ethernet, iSCSI, or Serial Attached SCSI.

A workload object is provided in operation 362. The workload object includes a transaction generator to generate transactions for testing a property or function of the device to be tested. The generated transactions will include the defined workload. For example, if the defined workload is to "read one sector", then the transactions generated can include a transaction which will cause the device under test to read one sector. The workload object can also include a goal for the respective test case. The goal defines an end to the respective test case. The goal can include a default goal in the respective test case such as a completion of the generation of the transactions that are generated by the transaction generator. For example, if the transaction generator is set to generate a transaction that will read one sector, then the default goal could be when the single sector has been read. Alternatively, if the transaction generator generates transactions such as write data at 33 MHz, then a goal may also be required such as to continue to generate transactions until two hundred sectors are filled or some other detectable end condition or event has been achieved.

A first device is tested with a first test case in operation 364. Executing the transaction generator on a first test object can produce the first test case. The first test object includes several interface properties such as defining the type of interface (e.g., SCSI, ATA, PCI, PCI-X, or other suitable interface type). A first set of transactions (i.e., the first test case) is produced when the transaction generator is executed using both the first test object and the defined workload. When the transactions in the first test case are applied to the first device to be tested, the defined workload is stimulated in the corresponding first device.

In one embodiment, the first interface object can also include multiple interface objects. For example, the interface objects can include a host interface object such as may be required to test the I/O device to host computer interface 312 described in FIG. 3A above. The interface objects can include a peripheral interface object such as may be required to test the I/O device to peripheral device interface 314.

The interface objects can also include one or more parameter objects. A parameter object can define a parameter that corresponds to an operating parameter of the first device. Parameters can include a frequency (e.g., clock frequency or data transfer rate) such as 33 MHz or 133 MHz. Other parameters can include settings that determine mixtures of transactions types. For example, if the transaction generator generates 100 read one sector transactions and 100 write one sector transactions, then the parameters can include settings such as read five sectors, then write five sectors or 40% read transactions and 60% write transactions or other settings to simulate a predicted mixture of transactions. Further, parameters can also include device specific settings such as if the device has multiple types of read transactions (e.g., a DMA read, a PIO read) then the parameters can include settings to simulate a predicted mixture of the types of read transactions.

A second device is tested with a second test case in operation 366. The second device testing is similar in all aspects to the first device testing described above.

In operation 368, the first test result from the first test case can be directly compared to the second test result from the second test case. Because the workload is exactly the same for both test cases, then the respective performances of the first device 202 and third device 220 can be directly compared. The method operations described in FIG. 3B above can be applied to either of a device simulation in a test bench simulation or similarly to an actual, hardware device.

Figure 4:
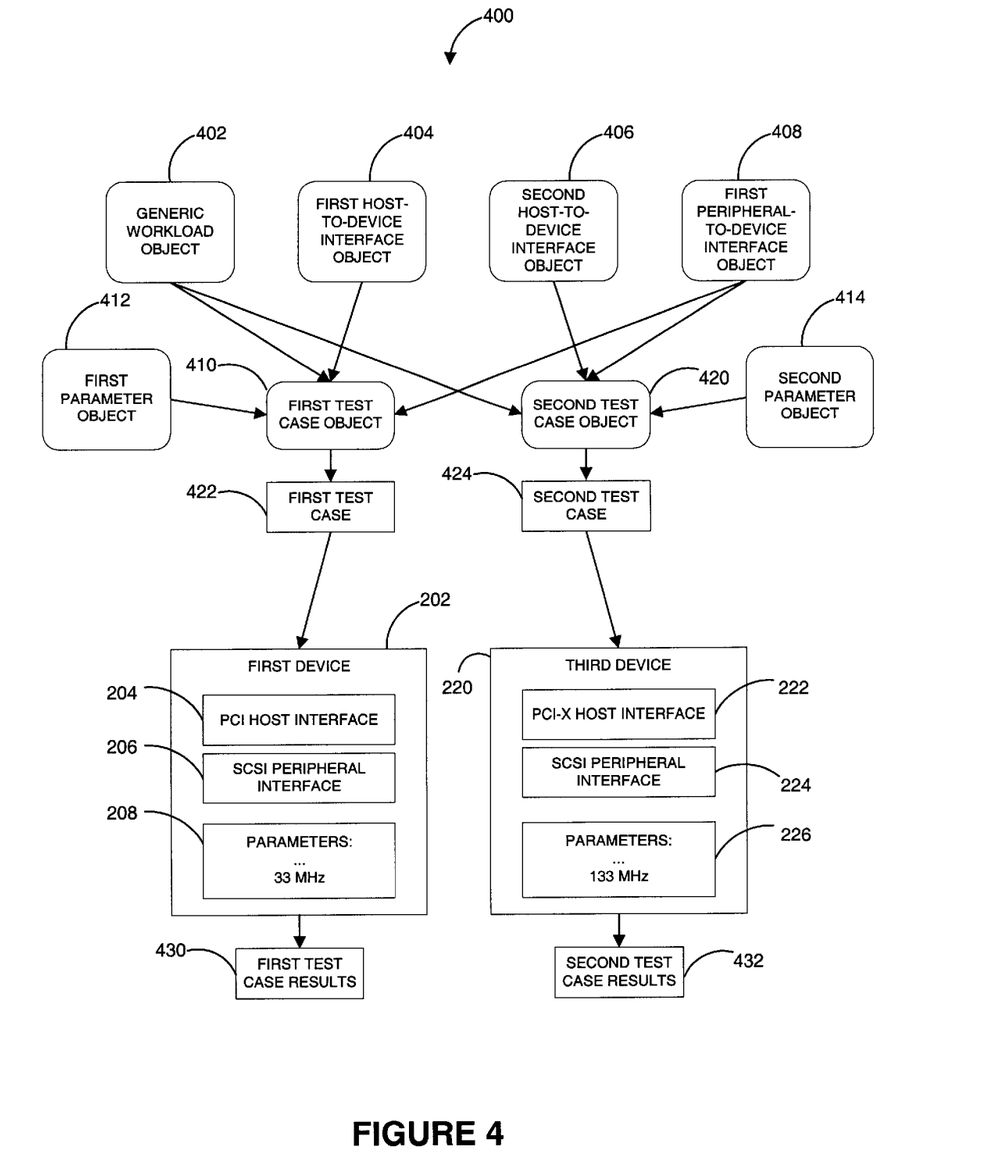
FIG. 4 is a block diagram of two test cases and two corresponding devices under test, in accordance with one embodiment of the present invention.

FIG. 4 is a block diagram of two test cases 422, 424 and two corresponding devices under test 202, 220, in accordance with one embodiment of the present invention. A generic workload is defined in the generic workload object 402, as described above. The first host-to-device interface object 404 defines the properties of the interface between the first device under test 422 and a host computer (e.g., host computer 318 above). The first parameter object 412 defines the parameters for the first test case object 410. The first peripheral-to-device interface object 408 defines the properties of the interface between the first device under test 422 and a peripheral device (e.g., peripheral device 320 above).

The first test case object 410 uses the generic workload object 402, the first host-to-device interface object 404, the first peripheral-to-device interface object 408 and the first parameter object 412 to produce the first test case 422. In one embodiment, the transaction generator uses the data structures in the four objects 402, 404, 412, 408 to produce transactions that are specifically formed according to the specifics defined in the four objects 402, 404, 412, 408 which corresponds to the configuration of the first device 202. The first test case can then be applied to the first device 202.

By way of example, the first host-to-device interface object 404 can define a PCI host interface so as to be compatible with the PCI host interface 204 within the first device 202. The first peripheral-to-device interface object 408 can define a SCSI peripheral interface so as to be compatible with the SCSI interface 206 in the first device. The first parameter object 412 can define the operating parameter of 33 MHz data transfer rate so as to be compatible with the 33 MHz parameter 208 of the first device 202. Therefore the resulting first test case 422 will include transactions compatible with the first device 202.

An exemplary generic workload object defined a workload that includes reading 200 megabytes of data from the peripheral device 320 and writing the 200 megabytes of data to the host computer 318. Therefore, the transactions in the first test case 422 would form read transactions to comply with the operating parameters defined by the first parameter object 412 (i.e., 33 MHz) and according to the SCSI peripheral interface requirements to read the 200 megabytes of data from the peripheral device 320. The transactions in the first test case 422 would also form write transactions to comply with the operating parameters defined by the first parameter object 412 (i.e., 33 MHz) and according to the PCI host interface 204 requirements to write the 200 megabytes of data to the host computer 318. Further, the parameters can define the mixture of transactions as described above. The first test results can include performance data such as the time required for the first device 202 to complete the transactions in the first test case 422.

Similarly, the second test case object 420 uses the generic workload object 402, the second host-to-device interface object 406, the first peripheral-to-device interface object 408 and the second parameter object 414 to produce the second test case 424. In one embodiment, the transaction generator uses the data structures in the four objects 402, 406, 408, 414 to produce transactions that are specifically formed according to the specifics defined in the four objects 402, 406, 408, 414 which corresponds to the configuration of the third device 220. The second test case 424 can then be applied to the third device 220.

For example, the second host-to-device interface object 406 can define a PCI-X host interface so as to be compatible with the PCI-X host interface 222 within the third device 220. The first peripheral-to-device interface object 408 can define a SCSI peripheral interface so as to be compatible with the SCSI interface 224 in the third device 220. The second parameter object 414 can define the operating parameter of 133 MHz data transfer rate so as to be compatible with the 133 MHz parameter 226 of the third device 220. Therefore, the resulting second test case 424 will include transactions compatible with the third device 220.

The exemplary genetic workload object defined above (i.e., reading 200 megabytes of data from the peripheral device 320 and writing the 200 megabytes of data to the host computer 318) can be applied to the third device 220. Therefore, the transactions in the second test case 424 would form read transactions to comply with the operating parameters defined by the second parameter object 414 (i.e., 133 MHz) and according to the SCSI peripheral interface requirements to read the 200 megabytes of data from the peripheral device 320. The transactions in the second test case 424 would also form write transactions to comply with the operating parameters defined by the second parameter object 414 (i.e., 133 MHz) and according to the PCI-X host interface 222 requirements to write the 200 megabytes of data to the host computer 318. Further, the second parameter object 414 can define the mixture of transactions as described above. The second test results can include performance data such as the time required for the third device 220 to complete the transactions in the second test case 424.

As shown in FIGS. 1 and 2 above, a single test object or class can inherit and extend multiple objects or classes. For example, in FIG. 4 above, the first test object 410 inherits and extends the generic workload object 402, the first host-to-device interface object 404, the first peripheral-to-device interface object 408, and the first parameter object 412. Each of the objects 402, 404, 408, 412 can be a basic generic object that could be applicable to multiple other distinct configurations of devices. In addition, recall that a basic, generic object such as the basic test object 110 of FIG. 1 above can include a goal. In one embodiment, the first test object 410 and the second test object 420 include respective goals. The goals may be included in the respective first test object 410 and second test object 420 or may be inherited from one of the respective inherited objects 402, 404, 406, 408, 412, 414. In an alternative embodiment, either of the first test case object 410 and/or the second test object 420 can inherit additional objects (not shown) instead of or in addition to the respective objects 402, 404, 406, 408, 412, 414 shown being inherited.

As discussed above, in object oriented programming, objects are instantiated by classes. The objects can be executed to perform the desired functions and operations. While discussed in terms of "objects" in FIGS. 1, 2 and 4 above, it should be understood that the invention is not limited to objects but rather can include classes which instantiate the objects described above.

The method operations described in FIG. 3B for the construction of a new test case and new test suites is simpler and therefore quicker than the prior art test case production methods because only a few test objects need to be modified to accommodate the unique features in the device under test. Maintenance of the test suite is also simpler because the base test object or objects are common and editing one common base test object modifies all of the test suites that include that base test object. The increased ease of maintenance leads to the previously developed test suites being more accurate and current. Therefore, if a previously developed test object, or a portion thereof, is selected as a basis for a new test object, then the new test object begins as being as accurate and current as possible. If the new test object begins as being as accurate and current as possible, then further modifications to the new test object leads to a more accurately and quickly developed test case.

The method operations described in FIG. 3B also provide more comparable test data from similar devices. Using common test objects and therefore common test transactions which are generated in common methods, ensures that the testing of one distinct configuration of a device is substantially similar to the testing of a second distinct configuration of the device. Substantially similar testing provides more accurately and directly comparable test data because the testing is performed in substantially the same order, via substantially the same test processes. For example there may be several methods to test a particular feature of a family of devices under test. However, because the transactions produced to test that feature are substantially the same, then the performance of that particular feature in one member of the family of devices can be directly compared to the corresponding performance of a second member of the family of devices.

Further, the test results of multiple devices can be more easily directly compared because the actual workload defined completely separate from the device specific configurations. Thus, the resulting performance data more directly reflects the actual respective performances of the similar devices.

While the above embodiments have been directed toward test cases and test benches applied to a device simulation, one skilled in the art will recognize that the concepts described can also be applied to actual hardware devices. Therefore, the test cases can also provide additional test data that compares the simulated device performance with the actual hardware device performance.

Figure 5:
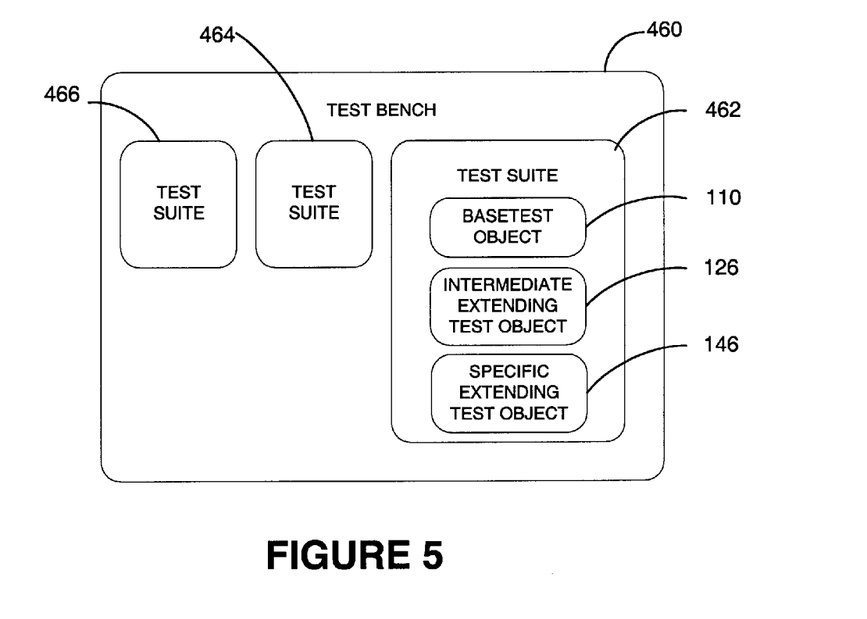
FIG. 5 illustrates a test bench in accordance with one embodiment of the present invention.

FIG. 5 illustrates a test bench in accordance with one embodiment of the present invention. The test bench includes a base test suite 362. The test suite 362 includes several test objects 110, 126, 146. Base test object 110 is a generic base test object as described above. Alternatively, the base test object 110 can include multiple generic objects such as objects 402, 404, 406, 408, 412, 414 described above in FIG. 4. Test objects 126 and 146 extend the base test object 110 (or objects 402, 404, 406, 408, 412, 414) such as described above in FIGS. 1 and 4. Test bench 360 can also include additional test suites 364, 366. Test suites 364, 366 include additional test objects. In one embodiment, the test suites 364, 366 include test objects that extend base test object 110.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations. An exemplary structure for the invention is described below.

Figure 6:
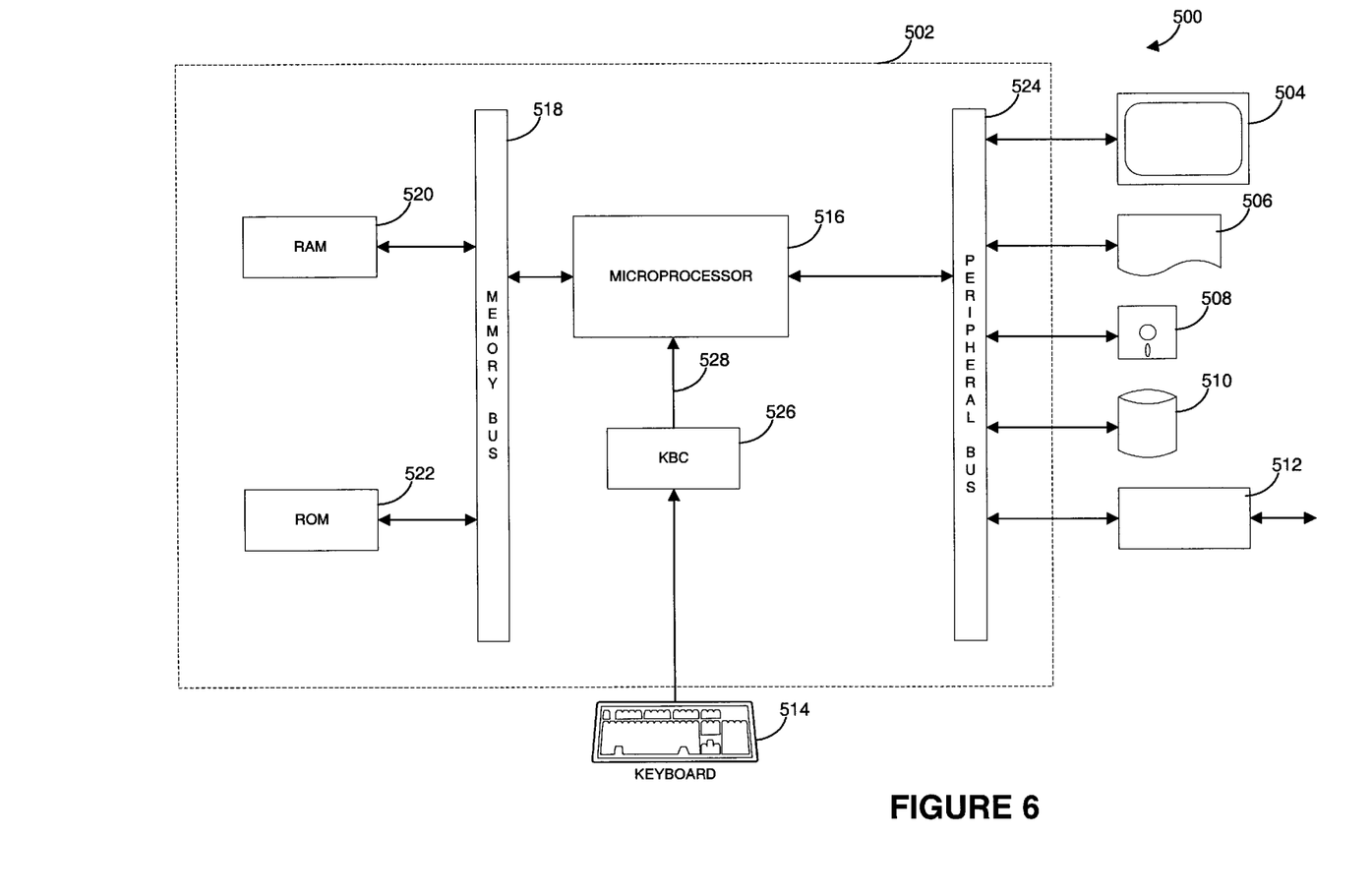
FIG. 6 shows a block diagram of an exemplary computer system in accordance with one embodiment of the present invention.

FIG. 6 shows a block diagram of an exemplary computer system 500 in accordance with one embodiment of the present invention. The computer system 500 includes a digital computer 502, a display screen (or monitor) 504, a printer 506, a floppy disk drive 508, a hard disk drive 510, a network interface 512, and a keyboard 514. The digital computer 502 includes a microprocessor 516, a memory bus 518, random access memory (RAM) 520, read only memory (ROM) 522, a peripheral bus 524, and a keyboard controller (KBC) 526. The digital computer 502 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 516 is a general-purpose digital processor, which controls the operation of the computer system 500. The microprocessor 516 can be a single-chip processor or can be implemented with multiple components. Using instructions retrieved from memory, the microprocessor 516 controls the reception and manipulation of input data and the output and display of data on output devices.

The memory bus 518 is used by the microprocessor 516 to access the RAM 520 and the ROM 522. The RAM 520 is used by the microprocessor 516 as a general storage area and as scratch-pad memory, and can also be used to store input data and processed data. The ROM 522 can be used to store instructions or program code followed by the microprocessor 516 as well as other data.

The peripheral bus 524 is used to access the input, output, and storage devices used by the digital computer 502. In the described embodiment, these devices include the display screen 504, the printer device 506, the floppy disk drive 508, the hard disk drive 510, and the network interface 512. The keyboard controller 526 is used to receive input from keyboard 514 and send decoded symbols for each pressed key to microprocessor 516 over bus 528.

The display screen 504 is an output device that displays images of data provided by the microprocessor 516 via the peripheral bus 524 or provided by other components in the computer system 500. The printer device 506, when operating as a printer provides an image on a sheet of paper or a similar surface. Other output devices such as a plotter, typesetter, etc. can be used in place of, or in addition to, the printer device 506.

The floppy disk drive 508 and the hard disk drive 510 can be used to store various types of data. The floppy disk drive 508 facilitates transporting such data to other computer systems, and hard disk drive 510 permits fast access to large amounts of stored data. The hard disk drive 510 can also include multiple hard disk drives and/or other mass storage devices such as CD-ROMs, CD-Rs, CD-RWs, magnetic tapes, and other optical and non-optical data storage devices.

The microprocessor 516 together with an operating system operates to execute computer code and produce and use data. The computer code and data may reside on the RAM 520, the ROM 522, or the hard disk drive 510. The computer code and data could also reside on a removable program medium and loaded or installed onto the computer system 500 when needed. Removable program media include, for example, CD-ROM, PC-CARD, floppy disk and magnetic tape.

The network interface 512 is used to send and receive data over a network connected to other computer systems. An interface card or similar device and appropriate software implemented by the microprocessor 516 can be used to connect the computer system 500 to an existing network and transfer data according to standard protocols.

The keyboard 514 is used by a user to input commands and other instructions to the computer system 500. Other types of user input devices can also be used in conjunction with the present invention. For example, pointing devices such as a computer mouse, a track ball, a stylus, or a tablet can be used to manipulate a pointer on a screen of a general-purpose computer.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter, be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over network coupled computer systems so that the computer readable code is stored and executed in a distributed fashion.

It will be further appreciated that the instructions represented by the blocks in FIG. 3B are not required to be, performed in the order illustrated, and that all the processing represented by the blocks may not be necessary to practice the invention. Further, the processes described in FIG. 3B can also be implemented in software stored in any one of or combinations of the RAM 520, the ROM 522, or the hard disk drive 510.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for comparing the performance of two devices comprising:

defining a workload;

providing a workload object which includes a transaction generator;

applying a first test case to a first device, the first test case being produced by executing the transaction generator on a first test object, the first test object including a plurality of first interface properties, and wherein executing the transaction generator on the first test object produces a first plurality of transactions according to the plurality of first interface properties, the first plurality of transactions stimulating the defined workload in the first device;

applying a second test case to a second device, the second test case being produced by executing the transaction generator on a second test object, the second test object including a plurality of second interface properties, and wherein executing the transaction generator on the second test object produces a second plurality of transactions according to the plurality of second interface properties, the second plurality of transactions stimulating the defined workload in the second device; and comparing a first test result from the first test case and a corresponding second test result from the second test case.

2. The method of claim 1, wherein the plurality of first interface properties are included in a first interface object and wherein the first test object inherits the first interface object and the workload object.

3. The method of claim 2, wherein the first interface object includes a plurality of interface objects.

4. The method of claim 3, wherein the plurality of interface objects includes a host interface object and a peripheral interface object.

5. The method of claim 3, wherein the plurality of interface objects includes a parameter object.

6. The method of claim 5, wherein the parameter object defines a parameter that corresponds to a parameter of the first device.

7. The method of claim 1, wherein the plurality of second interface properties are included in a second interface object and wherein the second test object inherits the second interface object and the workload object.

8. The method of claim 1, wherein the defined workload is generic to several members of a device family.

9. The method of claim 1, wherein the first plurality of transactions include at least one of a group consisting of a read, a write, an event and an interrupt.

10. The method of claim 1, wherein the second plurality of transactions include at least one of a group consisting of a read, a write, an event and an interrupt.

11. A method for comparing the performance of two devices comprising:

defining a workload;

providing a workload object which includes a transaction generator;

creating a first test case including:

providing a first parameter object which includes a first device parameter;

providing a first host interface object which includes a plurality of properties of an interface between a first device and a first host;

providing a first peripheral interface object which includes a plurality of properties of an interface between the first device and a first peripheral device;

extending the first parameter object, the first host interface object and the first peripheral interface object in a first test case object;

executing the transaction generator on the first test case object to create a first test case which includes a first plurality of transactions;

applying a first test case to a first device, the first plurality of transactions stimulating the defined workload in the first device;

creating a second test case including:

providing a second parameter object which includes a second device parameter;

providing a second host interface object which includes a plurality of properties of an interface between a second device and a second host;

providing a second peripheral interface object which includes a plurality of properties of an interface between the second device and a second peripheral device;

extending the second parameter object, the second host interface object and the second peripheral interface object in a second test case object;

executing the transaction generator on the second test case object to create a second test case which includes a second plurality of transactions;

applying a second test case to a second device, the second plurality of transactions stimulating the defined workload in the second device; and comparing a first test result from the first test case and a corresponding second test result from the second test case.

12. A test bench comprising:

a processor;

a storage facility coupled to the processor and containing instructions executable by the processor, the instructions including:

logic to receive a workload;

logic to provide a workload object which includes a transaction generator;

logic to apply a first test case to a first device, the first test case being produced by executing the transaction generator on a first test object, the first test object including a plurality of first interface properties, and wherein executing the transaction generator on the first test object produces a first plurality of transactions according to the plurality of first interface properties, the first plurality of transactions stimulating the defined workload in the first device;

logic to apply a second test case to a second device, the second test case being produced by executing the transaction generator on a second test object, the second test object including a plurality of second interface properties, and wherein executing the transaction generator on the second test object produces a second plurality of transactions according to the plurality of second interface properties, the second plurality of transactions stimulating the defined workload in the second device; and     logic to compare a first test result from the first test case and a corresponding second test result from the second test case.

13. The test bench of claim 12, wherein the plurality of first interface properties are included in a first interface object and wherein the first test object inherits the first interface object and the workload object.

14. The test bench of claim 13, wherein the first interface object includes a plurality of interface objects.

15. The test bench of claim 14, wherein the plurality of interface objects includes a host interface object and a peripheral interface object.

16. The test bench of claim 14, wherein the plurality of interface objects includes a parameter object.

17. The test bench of claim 16, wherein the parameter object defines a parameter that corresponds to a parameter of the first device.

18. The test bench of claim 12, wherein the plurality of second interface properties are included in a second interface object and wherein the second test object inherits the second interface object and the workload object.

19. The test bench of claim 12, wherein the defined workload is generic to several members of a device family.

20. The test bench of claim 12, wherein the first plurality of transactions include at least one of a group consisting of a read, a write, an event and an interrupt.

\* \* \* \* \*